April 23, 1963 R. L. HUNTINGTON 3,086,892

SEMICONDUCTOR DEVICES AND METHOD OF MAKING SAME

Filed Sept. 27, 1960

INVENTOR.
Richard L. Huntington
BY
W.S. Hill
Agent 3,086,892
Patented Apr. 23, 1963

3,086,892

SEMICONDUCTOR DEVICES AND METHOD OF MAKING SAME

Richard L. Huntington, Van Buren, Ohio, assignor to Radio Corporation of America, a corporation of Delaware Filed Sept. 27, 1960, Ser. No. 58,781
7 Claims. (Cl. 148—1.5)

Figure 1:
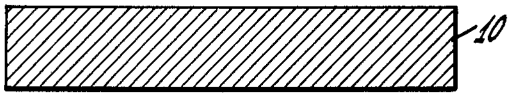

This invention relates to semiconductor devices, and more particularly to improved methods of making junction type semiconductor devices with uniform electrical characteristics.

A typical junction device of this class is the transistor, which comprises a semiconductive wafer with at least two PN junctions as rectifying barriers, and at least three electrodes, usually denoted emitter, collector, and base. Semiconductor devices of this class may be fabricated by the surface alloy or fusion method, in which a pellet of a material which produces conductivity of one type in a semiconductor material is positioned on a surface of a semiconductor wafer of the opposite conductivity type. The assemblage of wafer and pellet is then heated so as to melt the pellet material and alloy it into the surface of the semiconductor wafer, thus forming a PN junction at the interface of the different conductivity regions. A serious production problem in this method is the excessive and irregular lateral spreading of the pellet material over the surface of the semiconductor wafer during the alloying step. The spreading of the pellet material produces unsatisfactory devices for three reasons: first, the excessive spreading of the pellet material may cause a short circuit to the base electrode; second, the spreading of the pellet material causes excessive collector capacitance; third, irregular spreading causes junctions of variable size and shape, which results in devices having variable electrical characteristics from one unit to another, whereas junctions with uniform electrical characteristics are desired in order to provide devices with uniform performance. The excessive lateral spreading of the pellet material is particularly marked when purified semiconductor material having a low edge dislocation density is utilized.

There have been many attempts to solve this problem. One method has been to confine the spreading of the pellet to the desired area on the semiconductor wafer by coating the remaining surface of the wafer with a thin inert film, which prevents the pellet material from wetting that portion of the semiconductor wafer which is protected by the film and thereby confines the lateral spreading of the pellet material to the film-free portion of the wafer. Films previously used for this purpose include germanium oxide, silicon monoxide, silicon dioxide, and magnesium fluoride. Although these methods have been successfully utilized to fabricate satisfactory devices, further improvement is desirable as to ease of application in order to reduce handling cost.

An object of the present invention is to provide improved methods of making improved semiconductor devices.

Another object of the invention is to provide improved methods of making semiconductor devices with one or more rectifying barriers.

Still another object of the invention is to provide improved methods of making semiconductor devices of the alloy junction type having desirable electrical characteristics.

Another object of the invention is to provide improved methods of making semiconductor devices of the alloy junction type so as to prevent excessive lateral spreading of electrode pellets during alloying.

These and other objects of the invention are accomplished in the following manner: before the electrode pellet is alloyed to the semiconductor wafer so as to form a rectifying barrier, at least one member of the pellet-wafer pair is coated with a solution of a silicon compound selected from the group consisting of siloxanes and silicones dissolved in an organic solvent. The exact concentration of the solution is not critical, but preferably the solution utilized contains at least one-half (0.5) weight percent of the compound. The solution is permitted to dry, thus forming a thin film of the silicon compound on the pellet or on the wafer, or on both. The pellet is then alloyed into the wafer to form a rectifying barrier.

Figure 2:
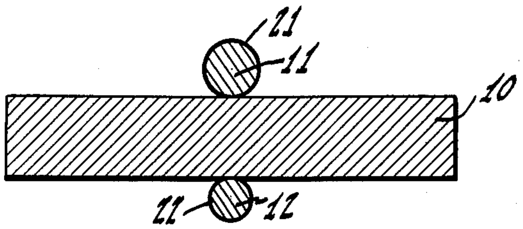
Figure 3:
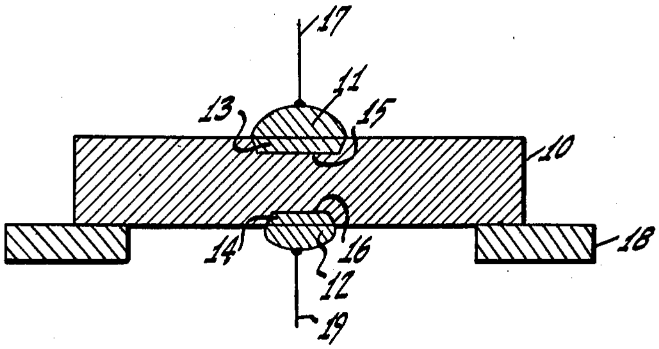

The invention will be described in greater detail with reference to the accompanying drawing, in which FIGURES 1 through FIGURE 3 are cross-sectional, schematic views of successive steps in the fabrication of a semiconductor device according to the invention.

Referring to FIGURE 1 of the drawing, a wafer 10 of semiconductive crystalline material is prepared with two opposing major faces. The wafer 10 may consist of germanium, silicon, germanium-silicon alloys, or the like, and may be of either conductivity type. For purposes of illustration, it will be assumed that wafer 10 consist of N-conductivity type germanium. Advantageously, the surface of wafer 10 is cleaned by treating the wafer with a mild etchant, and washing the wafer in distilled water.

The electrode pellets utilized in the fabrication of surface alloy junctions in N-conductivity type wafers contain a material which is an acceptor in the particular semiconductor utilized for the wafer. Suitable acceptors for the germanium wafer of this example include boron, aluminum, gallium, indium, and their alloys. The electrode pellets, also known as dots, may be of any convenient shape, such as spherules, discs, or rings. In this example, electrode pellets 11 and 12 consist of indium spherules.

For transistor fabrication, it is advantageous to utilize electrode pellets of two different sizes, and make the larger pellet (11 in this example) the collector electrode of the completed device. Electrode pellets 11 and 12 are immersed in a beaker containing a solution of a compound selected from the siloxanes and silicones in an organic solvent. In this example, the solution consists of one ml. Dimethyl-diethoxysilane and one hundred ml. xylene. The electrode pellets are rinsed in the solution, so that the surfaces of pellets 11 and 12 are uniformly coated with a thin film 21 and 22 respectively. The solution is then decanted and the pellets are dried on a sheet of filter paper. Alternatively, the solution is applied as a spray to the assemblage of wafer and pellets. Any convenient method of applying the solution may be utilized. The coated pellets 11 and 12 are then coaxially positioned on the opposing major faces of wafer 10 as shown in FIGURE 2.

Referring now to FIGURE 3, the electrode pellets 11 and 12 are alloyed to wafer 10 by heating the assemblage of wafer and pellets in a non-oxidizing atmosphere for about 10 to 20 minutes at a temperature of about 550° C. During this step the electrode pellets 11 and 12 melt and dissolve a portion of the semiconductor wafer material. When the assemblage is cooled, the dissolved wafer material precipitates and is recrystalized immediately beneath the pellets in the original crystal lattice of the wafer. The recrystallized regions 13 and 14 beneath the alloyed electrodes 11 and 12 respectively contain sufficient indium to be of P-conductivity type. Rectifying barriers or PN junctions 15 and 16 are thus formed at the interfaces between the P-type recrystalized regions 13 and 14 respectively and the N-type bulk of wafer 10.

During the alloying step the electrode pellets 11 and 12 tend to assume a hemispherical shape, as shown in FIGURE 3, due to the surface tension of the molten pellets. It is believed that during the heating step the siloxane compound is decomposed so as to leave a residue of silicon oxides adhering to the pellet and wafer surface. The adherent residue of silicon oxides acts as a sort of container around the electrode pellet and prevents excessive spreading of the pellets over the wafer surface during the alloying.

The device is completed by ohmically bonding a base tab 18 to wafer 10, and attaching terminal leads 17 and 19 to collector electrode 11 and emitter electrode 12 respectively. While the device illustrated is a triode transistor, various other types of devices such as rectifying diodes, tetrodes, and hook transistors may be fabricated in a similar manner.

In the above example, the electrode pellets only were coated with the silicone compound, but it will be understood that alternatively the advantages of the invention may be obtained by coating the wafer instead of the electrode pellets. If desired, both the wafer and electrode pellets may be coated. The silicone compound may be applied by any convenient technique, for example, by spraying a solution of the compound over the pellets or the wafers separately, or over the assemblages of pellets and wafers.

It will be understood that although the method of this invention has been described in terms of alloying P-type electrode pellets to an N-type wafer, the method is equally applicable to the alloying of N-type electrodes on P-type wafers. With germanium and silicon wafers, the N-type electrode pellets include such donors as phosphorus, arsenic, and antimony. When compound semiconductors such as indium phosphide, gallium aresenide, and the like are utilized, appropriate donors are selenium and tellurium, while appropriate acceptors are zinc and cadmium.

In the above example, the organic solvent was xylene but it will be appreciated that other organic solvents including aryl compounds such as benzene, toluene, and the like, and alkyl solvents such as acetone, propanol, and the like may be utilized instead of xylene. Other siloxanes such as tetraethoxysilane, amyl triethoxysilane, ethyl triethoxysilane, phenyl triethoxy silane, vinyl triethoxysilane, and the like, may be utilized in place of dimethyl diethoxysilane, since the siloxanes all decompose and leave a residue of silicon oxides, when heated. Other siloxane compounds having the general formula $H_3Si(OSiH_2)_nOSiH_3$, where $n$ is an integer, may also be utilized. The exact nature of the silicon oxide residue is not definitely ascertained but it is probably not a single substance such as silicon dioxide, but rather a mixture of silicon oxides.

The class of compounds known as silicones also decompose on heating so as to leave a residue of silicon oxides, and hence may also be utilized in the practice of the invention. The silicones are generally complex polymers of monomers having the general formula $R_1R_2SiO$, where $R_1$ and $R_2$ may be either aryl or alkyl groups. The silicones which are polymers of relatively low molecular weight end to remain liquids and are known as silicone oils; while the polymers of relatively high molecular weight tend to be solids, and are known as silicone resins. An example of a suitable silicone for the practice of the invention is that commercially available from Dow-Corning as DC–200, which may be obtained with viscosity ranging from 100 cp. to 200,000 cp. The low viscosity materials are oils, while the high viscosity materials approach the properties of a wax. An example of a silicone resin suitable for the practice of the invention is that commercially available from Union Carbide as XL–521. Surface alloy devices were fabricated as described above utilizing a solution comprising 1 ml. DC–200 in 100 ml. xylene to coat the electrode pellets. It was found that dot spreading was greatly reduced. Similar surface alloyed devices were fabricated as described above, utilizing a solution comprising 3.5 grams XL–521 in 100 ml. xylene. It was found that surface alloyed devices such as transistors made according to the prior art had a scrap rate of about 20 percent due to unsatisfactory alloying and spreading of the electrode pellets. In contrast, when the electrode pellets or the semiconductor wafers were coated in accordance with the invention with a compound selected from the siloxanes and silicones, the percentage of units scrapped due to unsatisfactory alloying and spreading of electrode pellets dropped to less than one percent.

What is claimed is:

1. The method of fabricating a rectifying barrier in a semiconductor wafer of a given conductivity type comprising the steps of preparing a pellet of electrode material capable of imparting to said wafer conductivity of the opposite type, coating said wafer and said pellet with a thin film of a substance selected from the group consisting of siloxanes and silicones, and alloying said pellet into said wafer at a temperature sufficient to decompose said film.

2. The method of fabricating a rectifying barrier in a semiconductor wafer of given conductivity type comprising the steps of preparing a pellet of electrode material capable of imparting to said wafer conductivity of the opposite type, coating said wafer and said pellet with a thin film of a substance selected from the group consisting of siloxanes and silicones, drying said coated member, and alloying said pellet into said wafer at a temperature sufficient to decompose said film.

3. The method of fabricating a rectifying barrier in a semiconductor wafer of given conductivity type comprising the steps of preparing a pellet of electrode material capable of imparting to said wafer conductivity of the opposite type, spraying a solution of a compound selected from the group consisting of siloxanes and silicones dissolved in an organic solvent over both said wafer and said pellet, drying said pellet and said wafer, and alloying said pellet into said wafer at a temperature sufficient to decompose said film.

4. The method as in claim 3, in which said solution contains at least one-half weight percent of said compound.

5. The method as in claim 4, in which said organic solvent consists of xylene.

6. The method of fabricating a rectifying barrier in a semiconductor wafer of given conductivity type, comprising the steps of preparing a pellet of electrode material capable of imparting to said wafer conductivity of the opposite type, coating said pellet with a thin film of a substance selected from the group consisting of siloxanes and silicones, and alloying said pellet into said wafer at a temperature sufficient to decompose said film and leave a silicon oxide residue on said pellet.

7. The method of fabricating a rectifying barrier in a semiconductor wafer of given conductivity type, comprising the steps of preparing a pellet of electrode material capable of imparting to said wafer conductivity of the opposite type, coating said pellet and said wafer with a thin film of a substance selected from the group consisting of siloxanes and silicones, and alloying said pellet into said wafer at a temperature sufficient to decompose said film and leaving a silicon oxide residue on said pellet.

References Cited in the file of this patent

UNITED STATES PATENTS

| | | |
|---|---|---|
| 2,796,562 | Ellis et al. | June 18, 1957 |
| 2,807,561 | Nelson | Sept. 24, 1957 |
| 2,832,702 | Schwartz | Apr. 29, 1958 |
| 2,913,538 | Harrington et al. | Nov. 17, 1959 |
| 2,932,594 | Mueller | Apr. 12, 1960 |